United States Patent [19]

Costabello et al.

[11] Patent Number: 5,619,451
[45] Date of Patent: Apr. 8, 1997

[54] METHOD FOR THE ERASURE OF A MEMORY, AND CIRCUITS FOR THE IMPLEMENTATION THEREOF

[75] Inventors: Claude Costabello; Jean-Marie Gaultier, both of Rousset, France

[73] Assignee: SGS-Thomson Microelectronics S.A., Saint Genis, France

[21] Appl. No.: 421,671

[22] Filed: Apr. 12, 1995

[30] Foreign Application Priority Data

Apr. 13, 1994 [FR] France .................... 94 04393

[51] Int. Cl.⁶ ........................................ G11C 11/34
[52] U.S. Cl. ................ 365/185.29; 365/185.33; 365/185.11
[58] Field of Search ............... 365/185.33, 185.29, 365/185.11, 236

[56] References Cited

U.S. PATENT DOCUMENTS

| | | | |
|---|---|---|---|
| 5,095,461 | 3/1992 | Miyakawa et al. | 365/185.33 X |
| 5,270,979 | 12/1993 | Harari et al. | 365/218 |
| 5,270,980 | 12/1993 | Pathak et al. | 365/185.33 X |
| 5,274,599 | 12/1993 | Ema | 365/218 |
| 5,297,096 | 3/1994 | Terada et al. | 365/218 |
| 5,384,743 | 1/1995 | Rouy | 365/185.33 |
| 5,388,083 | 2/1995 | Assar et al. | 365/185.33 |

FOREIGN PATENT DOCUMENTS

| | | |
|---|---|---|
| 0392895 | 10/1990 | European Pat. Off. |
| 4119394 | 12/1991 | Germany . |

OTHER PUBLICATIONS

French Search Report from French application 94 04393.
IEEE Journal of Solid-State Circuits, vol. 26, No. 11, Nov. 1991, New York US pp. 1600–1605 Nakayama et al. "A 60ns 16Mb Flash EEPROM With Program and Erase Sequence Controller".

*Primary Examiner*—David C. Nelms
*Assistant Examiner*—Huan Hoang
*Attorney, Agent, or Firm*—David M. Driscoll; James H. Morris; Brett N. Dorny

[57] ABSTRACT

A method for erasing a non-volatile electrically erasable and programmable integrated circuit memory that is divided into N sectors selected separately by addressing circuits and the cells for each sector being selected by row and column addressing circuits wherein an erasure pulse is applied simultaneously to all the sectors. The checking of the erasure of each sector leads to the locking of the sector when no defect is detected. A new erasure pulse is applied only to the unlocked sectors and only the unlocked sectors are rechecked. Also, a circuit for locking sectors in order to implement the method is disclosed.

23 Claims, 4 Drawing Sheets

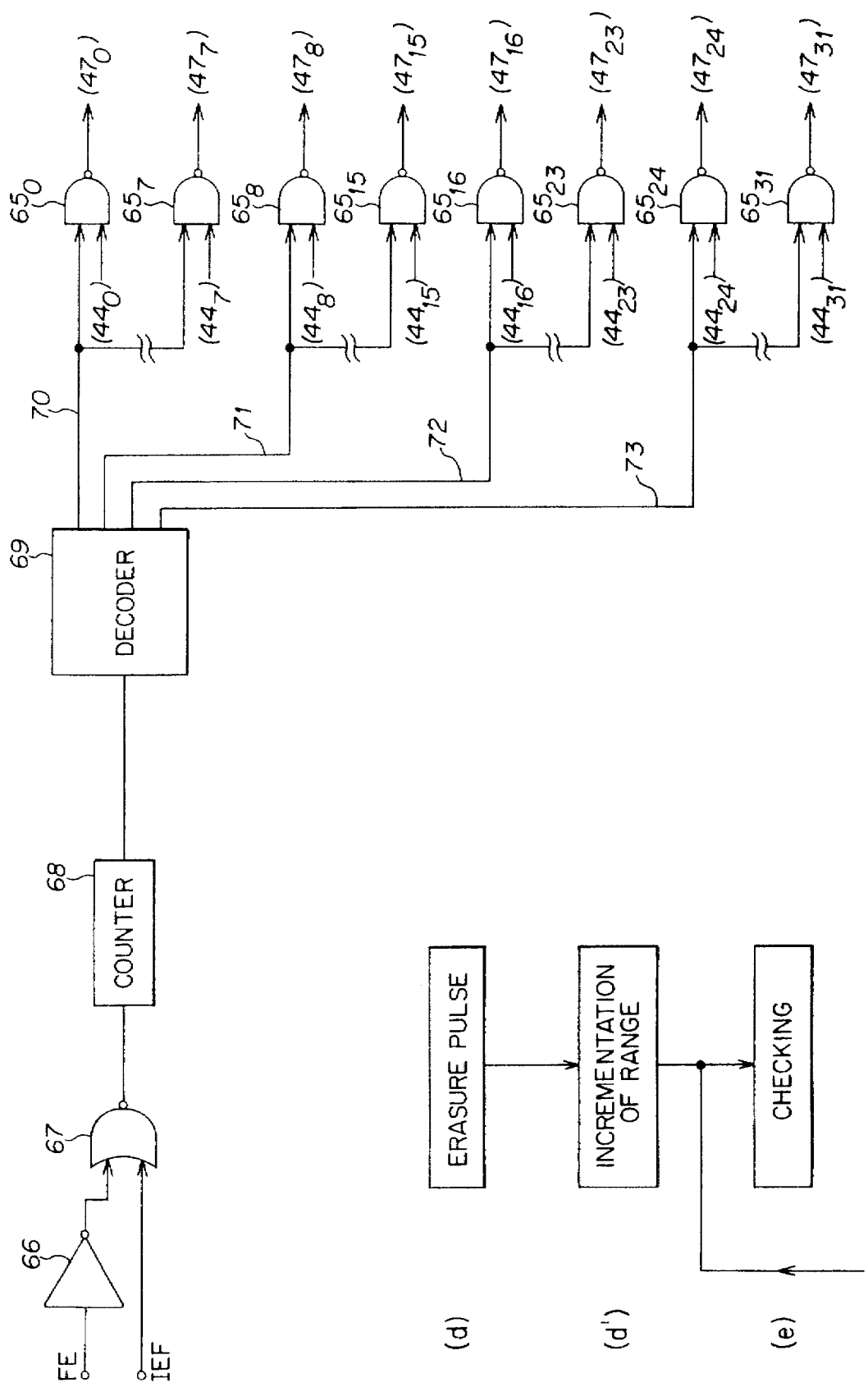

5,619,451

METHOD FOR THE ERASURE OF A MEMORY, AND CIRCUITS FOR THE IMPLEMENTATION THEREOF

BACKGROUND OF THE INVENTION

1. Field of the Invention

The invention relates to microprocessors and, more particularly, to a method for erasing a semiconductor memory associated with a microprocessor as well as to the circuits for the implementation thereof.

This memory is of the electrically erasable and programmable read-only type, better known as a FLASH EEPROM type. Such a memory is designed for recording instructions of the programs that are used by the central processing unit of the microprocessor to carry out the sequence of operations on the information or data elements to be processed. As a result of this use, this memory is addressed usually for the reading therein of the information elements that it contains, with the recording of the information elements being done from time to time in order to change the instructions therein as a function of the programs to be implemented. This recording is preceded by an operation for the erasure of the memory in order to place all its memory cells in a determined binary state.

2. Discussion of the Related Art

Such semiconductor memories have increasingly greater capacities that may possibly go up to 16-64 million memory cells (16 to 64 megabits) and are designed to replace magnetic memories on rotary disks. These memories have the following main advantages:

short access time for reading, no rotating mechanical parts, low supply voltage, low electrical consumption, increased reliability, and their manufacture is integrated with that of the microprocessor.

In order to modify the information elements in these semiconductor memories, it is necessary, as indicated hereabove, to erase them in order to place all the memory cells in a determined binary state, namely 1 or 0.

This erasing operation consists not only in erasing the memory cells but also in subsequently ascertaining that the erasure has indeed resulted in the determined binary state. If the verification indicates that certain memory cells are not in the desired state, a second erasing operation is performed, followed by a second checking operation, and so forth. This may result in a very lengthy period of erasure, on the order of several seconds, for there may be several hundreds of erasure cycles. Furthermore, when the erasure cycles occur, a phenomenon of cell depletion occurs and the conduction threshold of the cells is lowered.

The present invention is aimed at implementing a method for the total erasure of a semiconductor memory that leads to a reduction of the total duration of the erasure operation.

Semiconductor memories of this type, for example 64-megabit memories, may be organized in 32 sectors, each having 512,000 memory cells. This enables the recording, in each sector, of 64,000 words having eight bits each.

In the standard type of erasing method, the erasure is done sector by sector and consists in applying an erasure pulse to a selected sector, then ascertaining that each cell of the selected sector has been erased and applying another erasure pulse to the selected sector as soon as a faulty cell has been detected. This procedure leads to an erasure time that may be lengthy.

The method of the invention consists in applying an erasure pulse simultaneously to all the sectors, then in verifying the erasure sector after sector, locking the sector for which the verification has been satisfactory, applying a new erasure pulse to the unlocked sectors and then checking these unlocked sectors. Thus, the successive erasure cycles are applied only to sectors having defects of erasure. In this way, the erasure is checked only for sectors for which the previous verification had revealed defects. This leads to an appreciable gain in time. Furthermore, the erasure itself relates only to sectors having erasure defects. This reduces the phenomenon of depletion of the cells.

SUMMARY OF THE INVENTION

An object of the invention is therefore a method for the erasure of a non-volatile electrically erasable and programmable integrated circuit memory that is divided into N sectors selected separately by addressing circuits, the cells of each sector being selected by circuits for addressing by rows and columns, wherein said method includes the following steps:

(A) erasing the memory by the simultaneous application of a pulse to all the sectors;

(B) checking, sector by sector, the erasure of each cell of the memory;

(C) locking each sector for which the checking has not detected any unerased cell;

(D) checking that all the sectors are locked, if the answer is positive, the erasing operation ends, if the answer is negative, it proceeds to the next step;

(E) applying an erasure pulse to the unlocked sectors;

(F) checking, sector after sector, the unlocked sectors;

(G) returning to the step (C).

According to the invention, there is also proposed a circuit for the locking of a sector in a non-volatile electrically erasable and programmable integrated circuit memory that is divided into N sectors selected separately by addressing circuits, the cells of each sector being selected by circuits for addressing by rows and columns, the erasure of the memory being obtained by the simultaneous application of an erasure pulse to all the sectors, wherein said circuit includes:

a gate circuit on the supply circuit for the erasure of a sector to which the erasure pulse is applied; and a logic circuit for activating the closing or opening of the gate circuit depending on whether or not the sector is locked so that the sector is again erased only if said sector has at least one unerased cell.

BRIEF DESCRIPTION OF THE DRAWINGS

Other features and advantages of the present invention shall appear from the following description of a particular exemplary embodiment, said description being made with reference to the appended drawings, of which:

FIG. 4 is a flow chart showing particular steps of an alternative embodiment of the invention, and FIG. 5 is a diagram of a logic circuit that is added to the locking circuit of FIG. 3 in order to implement the alternative embodiment.

DETAILED DESCRIPTION

Figure 1:
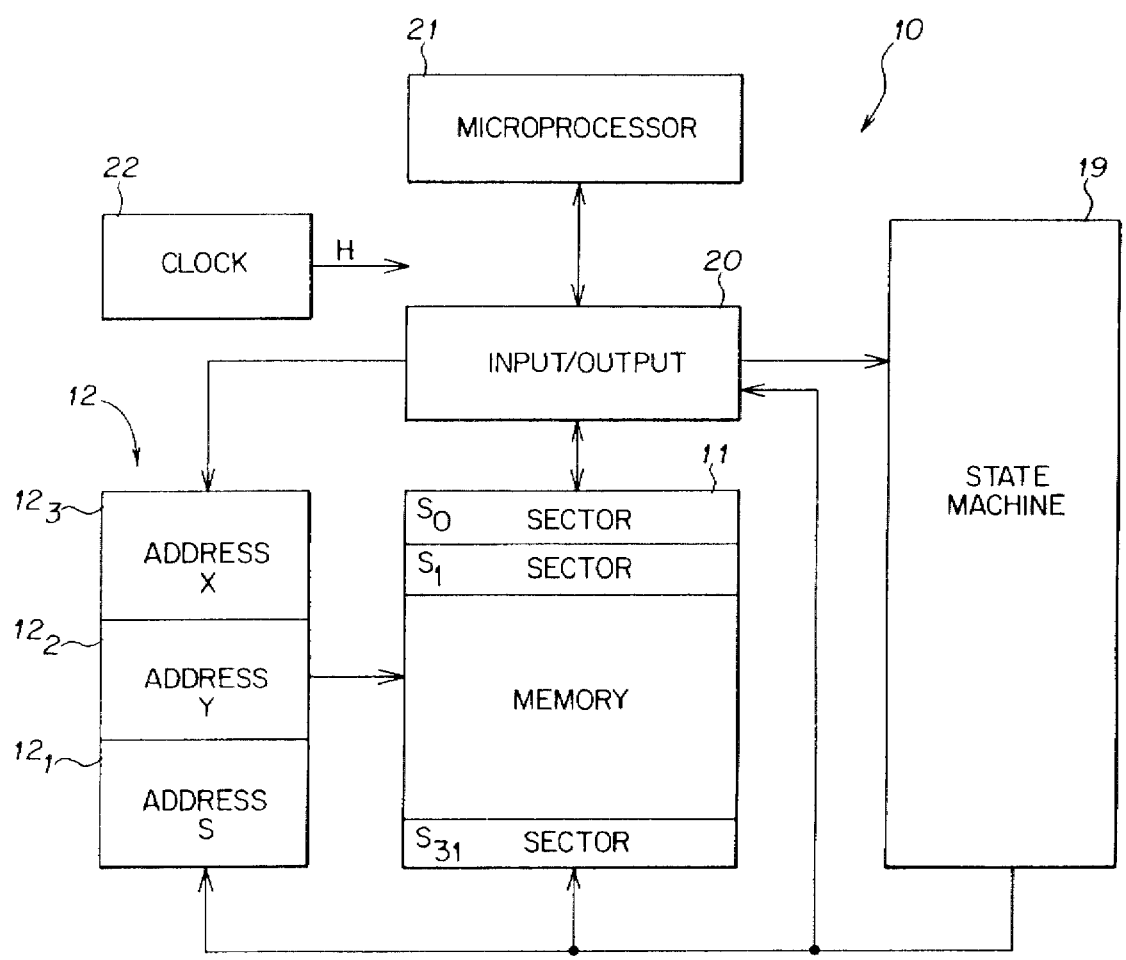
FIG. 1 is a functional block diagram of a semiconductor memory and of its associated circuits to which the erasing method according to the invention can applied.

In FIG. 1, the memory unit 10 that is associated with a microprocessor 21 includes a memory 11, circuits 12 for addressing the memory 11, a circuit 19 to control the memory 11, input/output circuits 20 of the memory 11, and a clock circuit 22 giving a clock signal H, these different elements being connected to one another in a known way.

By way of an example, the memory 11 has a capacity of about 16 megabits and is divided into 32 sectors S0 to S31 having each 512,000 memory cells which are assembled in eight-bit words, giving 64,000 words per sector. This memory is preferably of the type using integrated circuits and the cells are non-volatile electrically erasable and programmable cells, more particularly FLASH EEPROM type cells.

The addressing circuits 12 are organized so that each of them addresses 32 sectors S0 to S31 by means of a circuit 121, and in each sector, a memory word by means of circuits 122 (address Y for the columns of bits) and 123 (address X for the rows of words).

The input/output circuits 20 receive information or data elements from the microprocessor 21 and supply them to this microprocessor in the form of words or codes of 8 bits each. The control circuit 19 of the memory 11 is essentially a state machine that receives eight-bit codes from the input/output circuits 20 and pro, rides control signals to control the addressing circuits 12, the memory 11 and the input/output circuits 20.

The control circuits are designed to carry out specific operations on the memory 11 such as its reading, recording and erasure. In the case of the invention, the erasure will be done according to two different modes: one standard mode and the other mode, known as the total erasure mode, according to the features of the invention.

Figure 2:
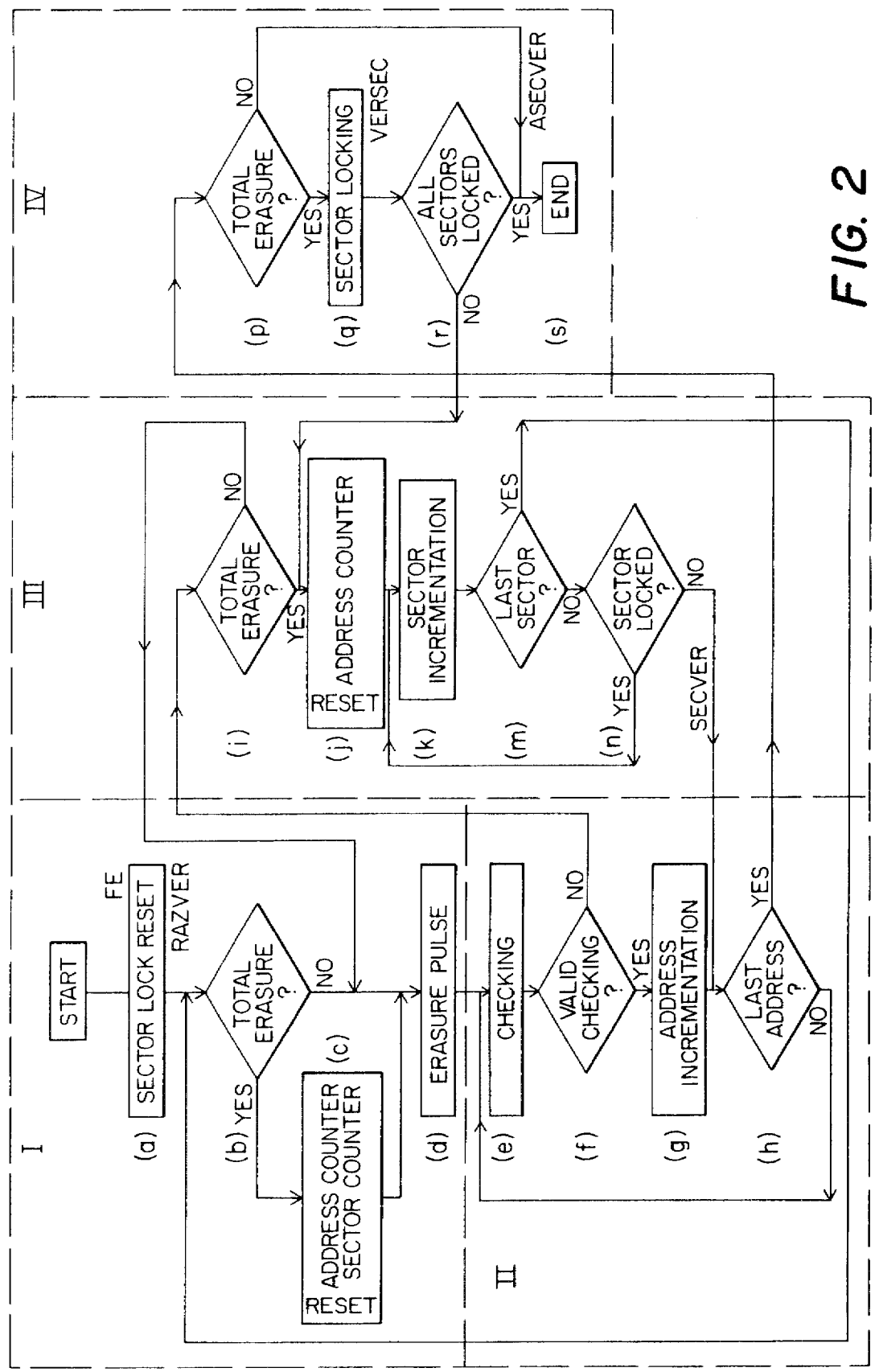
FIG. 2 is a flow chart showing the different operations of the erasing method according to the invention.

FIG. 2 shows a detailed diagram of the different steps of the mode or method of total erasure of the memory 11 when a total erasure instruction FE is detected. The initial state is "START" and is followed by the steps (a) Unlocking the sectors to enable their erasure and the checking of their erasure, namely the resetting (RAZ) of the locking of the sectors;

(b) Is the instruction an instruction for total erasure?
If the answer is positive, go to step (c);
If the answer is negative, go to step (d);

(c) Resetting (RAZ) a sector counter and an address counter inside each sector;

(d) Erasing the sectors by the application of an erasure pulse;

(e) Checking the erasure, cell by cell, of the cells of a sector;

(f) Is the cell erased?
If the cell is erased, go to step (g);
If the cell is not erased, go to step (i);

(g) Incrementing the address of the address counter to check the next cell;

(h) Is the incremented address greater than the last address of the sector?
If the answer is negative, return to step (e) for the checking of the cell corresponding to the incremented address;
If the answer is positive, go to step (p)

(i) If the cell being checked is not erased, is the instruction a total erasure instruction?
If the answer is negative, return to step (d);
If the answer is positive, go to step (j);

(j) Resetting (RAZ) of the address counter;

(k) Incrementing the sector counter by one unit;

(m) Is the incremented address:of the sector counter greater than the last address of the sector?
If the answer is negative:, go to step (n) to check the locking of the sector;
If the answer is positive, return to step (b);

(n) Is the sector locked?
If the sector is not locked, return to step (h);
If the sector is locked, ;return to step (k) for incrementing the sector counter;

(p) Should the address of the address counter be the last address of the sector, is the instruction a total erasure instruction?
If the answer is positive, go to step (q);
If the answer is negative, go to step "END";

(q) Locking the sector checked and found to be free of defects in the event of total erasure;

(r) Are the sectors all locked?
If the answer is negative, return to step (j) for resetting the address counter in the sector followed by the step (k) for incrementing the sector counter so as to check the next sector;
If the answer is positive, go to state (s) indicating the "END" of the erasure.

The different steps of the method that have just been described with reference to the diagram of FIG. 2 show that the method carries out the two modes of erasure according to the control signal applied thereto. Thus, when a cell is not erased in a sector (step (f)) and when the mode used is the standard mode (step (i)), a new erasure is carried out by sending an erasure pulse. Furthermore, when all the cells of a sector have been checked (step (h)) and when the mode used is the standard mode (step (p)) this is interpreted as being the end of the erasure. The detailed diagram of FIG. 2 shows four phases:

a first phase I that consists of applying an erasure pulse to the sectors;

a second phase II that consists of checking the erasure of each memory cell in a sector;

a third phase III that consists of going from one sector to the other for the checking; and a fourth phase IV that consists of locking the sector that has no erasure defect.

More concisely, the method according to the invention can be defined by the following steps of:

(A) applying a pulse to all the sectors S0 to S31 simultaneously;

(B) checking, sector after sector, the erasure of each cell of the memory;

(C) locking each sector for which the checking has not detected any unerased cell;

(D) checking that all the sectors are locked;
if the answer is positive, end of the erasing operation,
if the answer is negative, go to next step;

(E) applying an erasure pulse to the unlocked sectors;

(F) checking, sector after sector, the unlocked sectors;

(G) returning to the step (C).

Figure 3:
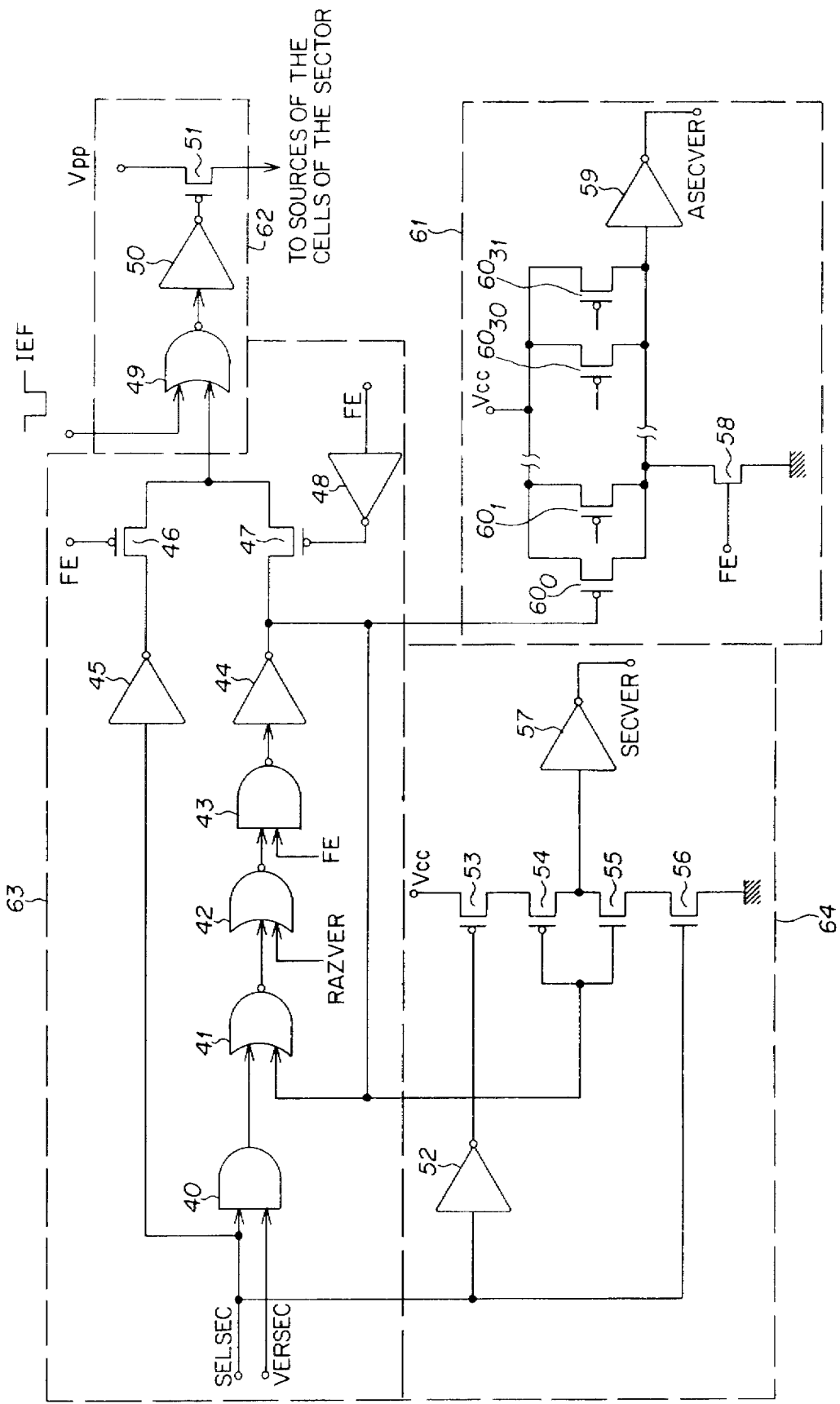
FIG. 3 is a diagram of a sector locking circuit according to the invention.

In order to lock the sectors as and when they are checked, there is provision for one locking circuit per sector, such as the one shown in FIG. 3, so as to prevent the application of the erasure pulse to the locked sectors.

This locking circuit has an AND circuit 40 with two input terminals, to one of which there is applied the selection signal SELSEC (FIG. 2) for the selection of the concerned sector, for example The sector S0 while, to the other input terminal, there is applied the sector locking signal. The output terminal of the AND circuit 40 is connected to one of the two input terminals of a first NOR circuit 41, the other input terminal of which is connected to the output terminal of an inverter circuit 44. The output terminal of this first NOR circuit 41 is connected to one of the two input terminals of a second NOR circuit 42, the other input terminal of which receives a signal RAZVER for resetting the locking of the section (FIG. 2).

The output terminal of this second NOR circuit 42 is connected to one terminal of the two input terminals of a NAND circuit 43, the other input terminal of which receives the total erasure signal FE.

The output terminal of the NAND circuit 43 is connected to the input terminal of the inverter circuit 44, the output terminal of which is connected to the input terminal of the first NOR circuit 41, as described hereabove.

The output terminal of the inverter circuit 44 is also connected, firstly, to the drain of a P-type MOSFET transistor 47 and, secondly, to the gate of a P-type MOSFET transistor 600 which forms part of a NAND circuit 60.

This NAND circuit 60 has as many MOSFET transistors 600, 601, . . . , 6031 as it has sectors, the gate of each transistor being connected to the output terminal of the inverter circuit 44 of the locking circuit for the associated sector.

The source of the transistor 47 is connected to an input terminal of a third NOR circuit 49 that has another input terminal receiving the erasure pulse IEF. The source of the transistor 47 is also connected to the source of a P-type MOSFET transistor 46.

The gate of the transistor 46 receives the total erasure signal FE while the drain is connected no the output terminal of an inverter circuit 45 the input terminal of which receives the sector selection signal SELSEC which is also applied to the AND circuit The output terminal of the NOR circuit 49 is connected to an inverter circuit 50 the output terminal of which is connected to the gate of a P-type MOSFET transistor 51. The drain of the transistor 51 is connected to the supply voltage Vpp while the source is connected to the sources of the transistors constituting each cell of the memory.

The sector selection signal SELSEC is applied directly to the gate of an N-type MOSFET transistor 56 and, by means of an inverter circuit 52, to the gate of a P-type MOSFET transistor 53. The drain of the transistor 53 is connected to the supply voltage Vcc while its source is connected to the drain of a P-type MOSFET transistor 54. The source of the transistor 56 is also connected to the ground potential while its drain is connected to the source of an N-type MOSFET transistor 55 the drain of which is connected to the source of the transistor 54. The gates of the transistors 54 and 55 are connected to each other and to the output terminal of the inverter circuit 44. The point that is common to the source and drain of the transistors 54 and 55 is connected to the input terminal of an inverter circuit 57 that is common to all the sectors such as the NAND circuit 60. The output terminal of the inverter circuit 57 gives the signal SECVER indicating that the sector is locked.

In FIG. 3, the NAND circuits 600 to 6031 and the inverter circuit 57 which are common to all the sectors have been grouped together under reference 61. The circuit of FIG. 3 can be divided functionally into several elements:

a gate circuit 62 comprising the elements 49 to 51;

a locking/unlocking circuit 63 comprising the elements 40 to 48;

a circuit 64 to detect the locking of the sector comprising the elements 52 to 57; and a circuit 61 to detect Eke locking of all the sectors comprising the elements 58 to 60.

The circuits 61, 63 and 64 form a logic circuit for the control of the gate circuit 62.

The sector locking circuit such as the one described with reference to FIG. 3 works as follows. When a sector is selected (signal SELSEC) in standard mode, the transistor 46 is on because the total erasure signal FE is absent. The NOR circuit 49, which receives the erasure pulse IEF, provides a signal to turn the transistor 51 on by means of the inverter 50. The erasure pulse is therefore applied, in standard mode, only to the cells of the sector selected by SELSEC, in the total erasure mode, the transistor 47 may become conductive for the total erasure signal FE is applied to the inverter circuit 48. As above, the transistor 51 turns on and applies the erasure pulse IEF to all the cells of the selected sector.

However, this erasure pulse IEF should be applied only to the unlocked sectors. This means that the transistor 47 should not become conductive when the sector is locked. This is obtained by the signal VERSEC (step (q)) for the selected sector (signal SELSEC): the AND circuit 40 then provides a level 1 so that the output terminal of the NOR circuit 41 is at the level 0; this is also the case with the output terminal of the NOR circuit 42 which is therefore at the level 0. The output terminal of the AND circuit 43 is at the level 0 which leads to a level 1 at the output terminal of the inverter circuit 44, thus turning the transistor 47 off.

At the beginning of the total erasure mode, the sectors are all locked but no sector is selected so that the output terminal of the AND circuit 40 is at the level 0. The output terminal of the NOR circuit 41 is also at the level 0 for the second input terminal is at the level 1 corresponding to the locking. When the signal RAZVER (step (a)) goes to the level 1, The output terminal of the NOR circuit 42 goes to the level 0. Since the signal FE is present, the output terminal of the NAND circuit 43 goes to the level 1 while the output terminal of the inverter circuit 44 goes to the level 0.

The level 0 of the inverter circuit 44 is applied to the input terminal of the NOR circuit 41 while the level 0 is applied to the other input terminal. The output terminal of the NOR circuit 41 goes to the level 1.

Since the signal RAZVER has returned to the level 0, the output terminal of the NOR circuit 42 remains at the level 0.

The output terminal of the NAND circuit 43 remains at the level 1 and the output terminal of the inverter circuit 44 remains at the level 0 corresponding to the unlocking operation.

When all the cells of a selected sector (SELSEC) have been checked as being erased, the signal VERSEC (step (q)) appears so that the AND circuit 40 is open and its output terminal goes to the level 1. Since the output terminal of the inverter circuit 44 is at the level 0 (unlocked circuit), the output terminal of the NOR circuit 41 goes to the level 0. Since the signal RAZVER is at the level 0, the output terminal of the NAND circuit 43 goes to the level 0 while the output terminal of the inverter circuit 44 goes to the level 1.

Prior to the end of the checking operation of the sector, the level 0 of the inverter circuit 44 is applied to the gates of the transistors 54 and 55 so that only the transistor 54 may be conductive. Furthermore, since the sector is selected, a level 0 is applied to the gate of the transistor 53 which makes it conductive through the transistor 54. The input terminal of the inverter circuit 57 is then at the level 1 and its output terminal is at the level 0. This means that the sector is not locked.

At the end of the checking operation, following the appearance of the signal VERSEC, the output terminal of the inverter 44 goes to the level 1 which is applied to the transistor 54 in order to turn it off. By contrast, the transistors 55 and 56 become conductive and apply the level 0 to the input of the inverter circuit 57 whose output terminal goes to the level 1.

When at least one sector is not locked, a level 0 is applied to the gate of the transistor 60 that corresponds to the sector so that this transistor is conductive through the transistor 58 which receives the signal FE. A level 1 is therefore applied to the input terminal of the inverter circuit 59 and its output terminal is then at the level 0. By contrast, when all sectors are locked, no transistor 600 to 6031 is conductive and the level 0 is applied to the input terminal of the inverter circuit 59 the output terminal of which then goes to the level 1 for the signal ASECVER.

The invention has been described in the case of an erasure pulse applied simultaneously to all the sectors of the memory. This process implies an erasure current that has a high value. Hence, to limit this erasure current, the invention proposes, in one alternative embodiment, to apply the erasure pulse only to a group of sectors, for example to eight of them, which amounts in this example to dividing the thirty-two sectors into four groups of eight sectors each, for example a first group for the sectors S0 to S7, a second for the sectors S8 to S15, a third range for the sectors S16 to S23 and a fourth range for the sectors S24 to S31.

To achieve this alternative embodiment, the method that has been described with reference to FIG. 2 must include an additional step for the incrementation of a counter of groups between the steps (d) and (e) (FIG. 4) while the locking circuit of FIG. 3 must include a NAND circuit 65 (FIG. 5) having one of its two input terminals connected to the output terminal of the inverter circuit 44 and its other input terminal connected to the output terminal of the group counter which shall be described with reference to the FIG. 5.

Thus, in FIG. 4, a step (d') for the incrementation of a group is inserted between the step (d) for the application of an erasure pulse and the step (e) for checking the erasure of all the sectors.

In FIG. 5, the NAND circuit 65 which is added to each locking circuit (NAND circuits 650 to 6531) is controlled by the output signals of a decoder 69 of the four states of the binary counter 68 of the groups, the counter and the decoder forming a multiplexer circuit.

The output signals of the decoder 69 are applied by means of the conductors 70, 71, 72 and 73 which are connected respectively to the NAND circuits 650 to 657 for the sectors of the first group, 658 to 6515 for the sectors of the second group, 6516 to 6523 for the sectors of the third group and 6524 to 6531 for the sectors of the fourth group. The input terminal of the two-digit binary counter 68 is connected to the output terminal of a two-input NAND circuit 67, one input terminal of which receives the forward feed pulse IEF while the other input terminal receives the total erasure signal FE by means of an inverter circuit 66.

In FIG. 5, the subscript values 0 to 31 indicate the rank of the sector while the references with which they are associated indicate those of the logic circuits of FIG. 3.

This alternative embodiment of the invention then operates as follows. The erasure pulse increments the group counter 68 by one unit. This enables the selection of the sectors of the next group, for example the second group, the sectors of which will receive the erasure pulse. The step (e) of checking the erasure is then carried out in the same way as in the total erasure method. If, after all the sectors of the memory have been checked, one of them is not erased and is therefore not locked, a new erasure pulse is prepared. This increments the counter 68 by one unit so that the erasure pulse is applied to all the sectors of the next group, namely the third group. Then a new erasure checking step (e) is implemented for all the sectors and so on and so forth until all the sectors are locked.

In short, in this alternative embodiment, the erasure pulse is applied only to one group of sectors but the erasure is checked for all the unlocked sectors.

In the general method of the invention, this alternative consists in modifying the description of the steps (A) and (E) to indicate that the erasure pulse is applied to the sectors of a group.

More generally, the number of groups will be m and each group will have n sectors such that $(m)(n)=N$.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A method for erasing a non-volatile electrically erasable and programmable integrated circuit memory that is divided into N sectors selected separately by addressing circuits having a sector counter, wherein the N sectors are arranged in m groups of n sectors each, the cells of each sector being selected by addressing circuits for addressing by rows and columns having an address counter, wherein said method comprises the following steps:

(A) erasing the cells of the memory by the simultaneous application of a pulse to at least all the sectors of a group;

(B) detecting erasure of cells of the memory in each sector of the group, until one of an unerased cell and the last cell of a sector is detected;

(C) locking each sector for which no unerased cell is detected;

(D) determining whether all the sectors are locked;

(E) applying an erasure pulse to the unlocked sectors of a next group; and (F) returning to step (B).

2. A method according to claim 1, wherein the step (A) includes the following steps:

(a) unlocking the sectors to enable erasure and determination of erasure of cells in the sectors;

(b) determining whether total erasure is to be performed;

(c) resetting the sector counter and the address counter inside each sector if total erasure is to be performed;

(d) applying an erasure pulse to at least all the sectors of a group.

3. A method according to claim 1, wherein step (A) includes the step of simultaneously applying an erasure pulse to all the sectors of all the groups.

4. A method according claim 1, wherein the step (B) includes the following steps:

(e) determining erasure of a cell at the address of the address counter;

(f) Proceeding to step (C) if the cell is not erased;

(g) incrementing the address of the address counter if the cell is erased;

(h) determining if the address of the address counter is greater than the address of the last cell in the sector; and (i) repeating steps (e) through (i).

5. The method according to claim 1, wherein step (C) comprises the following steps:

(k) locking the sector if no unerased cell is detected;

(l) resetting the address counter;

(m) incrementing the sector counter;

(n) going to step (D) if the sector counter is greater than the last sector of the group;

(o) determining whether the next sector is locked;

(p) repeating steps (m) through (o) if the next sector is locked;

(q) going to step (B) if the next sector is not locked.

6. A method according to claim 1, wherein step (D) includes the following steps:

(r) checking whether all of the sectors are locked;

(s) terminating operation if all sectors are locked;

(t) resetting the address counter;

(u) incrementing the sector counter to the first sector of the next group.

7. A circuit for locking a sector in a non-volatile electrically erasable and programmable integrated circuit memory that is divided into N sectors selected separately by addressing circuits having a sector counter, wherein the N sectors are arranged in m groups of n sectors each, the cells of each sector being selected by circuits for addressing by rows and columns having an address counter, the erasure of the memory being obtained by the simultaneous application of an erasure pulse to at lease all the sectors of a group, wherein said circuit comprises:

a gate circuit on a circuit for supplying the erasure pulse to the sector; and a logic circuit for selectively closing and opening the gate circuit so that the sector is erased only if said sector has at least one unerased cell.

8. A locking circuit according to claim 7, wherein the logic circuit includes:

a locking/unlocking circuit for opening the gate circuit at the start of the erasure operation;

a circuit for detecting the locking of the sector; and a circuit for detecting the locking of all the sectors.

9. A locking circuit according to claim 8, wherein an erasure pulse is applied to sectors of a group, and wherein the locking/unlocking circuit includes:

a group counter with m states which is activated by the erasure pulses, and a multiplexer controlled by the state signals of said group counter to select the group the sectors of which will receive the erasure pulse.

10. A locking circuit according to claim 7, wherein said gate circuit includes:

a pulse control circuit for selectively applying an erasure pulse; and a lock detection circuits for inhibiting said erasure pulse if said sector is locked.

11. A locking circuit according to claim 7, further comprising:

a plurality of gate circuits, each corresponding to one of said sectors;

a plurality of locking/unlocking circuits, each corresponding to one of said sectors; and a lock determining circuit, connected to each of said plurality of locking/unlocking circuits, for determining whether all of said sectors are locked.

12. A locking circuit according to claim 11, further comprising a group circuit for selectively identifying a group of sectors, and wherein said locking/unlocking circuit locks said sector when said sector is not in the group identified by said group circuit.

13. A method for erasing a non-volatile electrically erasable and programmable integrated circuit memory, comprising the steps of:

unlocking sectors of said memory to be erased;

applying an erasure pulse to said unlocked sectors;

detecting cells in each sector until an unerased cell is detected;

locking sectors which have no unerased cells;

repeating the applying and locking steps until all sectors are locked.

14. The method of claim 13, wherein said unlocking step includes closing a gate on a supply circuit supplying said erasure pulse to a sector, and wherein said locking step includes opening said gate.

15. The method of claim 14, further comprising the step of determining whether all of said sectors are locked, wherein said determining step determines whether a gate for each of said sectors is open.

16. The method of claim 13, wherein said erasure pulse is simultaneously applied to all of said sectors.

17. The method of claim 13, wherein said erasure pulse is consecutively applied to groups of said sectors.

18. A erasure circuit for erasing a non-volatile electronically erasable and programmable integrated circuit memory comprising:

erasure pulse means for selectively applying an erasure pulse to sectors of said memory; and erasure determining means for determining if each cell of a sector has been erased until an unerased cell is found;

locking means connected to the erasure determining means for locking a sector if all cells of said sector are erased.

19. The erasure circuit of claim 18, further comprising:

means for dividing said sectors into groups; and group application means for simultaneously applying said erasure pulse to all of the sectors in a group.

20. The erasure circuit of claim 19, wherein said group application means includes:

a group counter having states for each of said groups; and a multiplexer controlled by state signals from said group counter for selecting a group of sectors to which the erasure pulse is applied.

21. The erasure circuit of claim 18, wherein said erasure pulse means includes a gate circuit, and wherein said locking means includes a control circuit for opening and closing said gate circuit.

22. The erasure circuit of claim 18, further comprising lock determining means for determining whether all sectors of said memory are locked.

23. The erasure circuit of claim 22, wherein said lock determining means includes a plurality of gates corresponding to each of said sectors connected to respective locking means.

* * * * *